(12) United States Patent
Stahl et al.

(10) Patent No.: US 10,775,253 B2
(45) Date of Patent: Sep. 15, 2020

(54) METHOD FOR PRODUCING A MICROMECHANICAL COMPONENT WITH AN EXPOSED PRESSURE SENSOR DEVICE AND MICROMECHANICAL COMPONENT

(71) Applicant: Robert Bosch GmbH, Stuttgart (DE)

(72) Inventors: Heiko Stahl, Reutlingen (DE); Arne Dannenberg, Metzingen (DE); Daniel Haug, Neuffen (DE); Daniel Kaercher, Stuttgart (DE); Michaela Mitschke, Reutlingen (DE); Mike Schwarz, Kusterdingen (DE); Timo Lindemann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/330,552

(22) PCT Filed: Aug. 24, 2017

(86) PCT No.: PCT/EP2017/071287
§ 371 (c)(1),
(2) Date: Mar. 5, 2019

(87) PCT Pub. No.: WO2018/046307
PCT Pub. Date: Mar. 15, 2018

(65) Prior Publication Data
US 2020/0225108 A1 Jul. 16, 2020

(30) Foreign Application Priority Data
Sep. 6, 2016 (DE) .......... 10 2016 216 870

(51) Int. Cl.
*H01L 29/84* (2006.01)
*G01L 9/00* (2006.01)
(Continued)

(52) U.S. Cl.
CPC ............ *G01L 9/008* (2013.01); *B81B 3/0018* (2013.01); *B81C 1/00325* (2013.01); *H01L 41/27* (2013.01); *B81B 2201/0264* (2013.01)

(58) Field of Classification Search
CPC ....... G01L 9/008; H01L 41/27; B81B 3/0018; B81C 1/00325
(Continued)

(56) References Cited

U.S. PATENT DOCUMENTS 5,736,430 A * 4/1998 Seefeldt .............. B81C 1/00158
438/53
2005/0204821 A1* 9/2005 Fischer ................. B81B 7/0029
73/715

FOREIGN PATENT DOCUMENTS

DE          69602056 T2    12/1999
DE       102004036032 A1     7/2005
(Continued)

OTHER PUBLICATIONS

International Search Report dated Nov. 7, 2017 of the corresponding International Application PCT/EP2017/071287 filed Aug. 24, 2017.

*Primary Examiner* — Long K Tran
(74) *Attorney, Agent, or Firm* — Norton Rose Fulbright US LLP; Gerard Messina (57) ABSTRACT

A method for manufacturing a micromechanical component having a disengaged pressure sensor device includes: configuring an electrically conductive sacrificial element in or on a first outer surface of a first substrate; applying a second substrate on or upon the outer surface of the first substrate over the sacrificial element; configuring a pressure sensor device by anodic etching of the second substrate; configuring in the second substrate at least one trench that extends to
(Continued)

the sacrificial element; and at least partly removing the sacrificial element in order to disengage the pressure sensor device.

7 Claims, 6 Drawing Sheets

(51) Int. Cl.
*H01L 41/27* (2013.01)
*B81B 3/00* (2006.01)
*B81C 1/00* (2006.01)

(58) Field of Classification Search
USPC .......................................................... 257/415
See application file for complete search history.

(56) References Cited

FOREIGN PATENT DOCUMENTS

| | | |
|---|---|---|
| DE | 102004036035 A1 | 7/2005 |
| DE | 102006022377 A1 | 11/2007 |
| DE | 102007010711 A1 | 9/2008 |
| DE | 102008002668 A1 | 12/2009 |
| DE | 102014224063 B3 | 3/2016 |
| DE | 102015116353 A1 | 5/2016 |
| EP | 3141521 A1 | 3/2017 |

\* cited by examiner

METHOD FOR PRODUCING A MICROMECHANICAL COMPONENT WITH AN EXPOSED PRESSURE SENSOR DEVICE AND MICROMECHANICAL COMPONENT

CROSS-REFERENCE TO RELATED APPLICATIONS

The present application is the national stage of International Pat. App. No. PCT/EP2017/071287 filed Aug. 24, 2017, and claims priority under 35 U.S.C. § 119 to DE 10 2016 216 870.3, filed in the Federal Republic of Germany on Sep. 6, 2016, the content of each of which are incorporated herein by reference in their entireties.

FIELD OF THE INVENTION

The present invention relates to a method for manufacturing a micromechanical component having a disengaged pressure sensor device and to a micromechanical component having a disengaged pressure sensor device. The pressure sensor device can in particular have a pressure sensor membrane, or can be made up of a pressure sensor membrane having corresponding electrical contacting.

BACKGROUND

Micromechanical pressure sensors are often realized as piezoresistive pressure sensors. Piezoresistive pressure sensors are inherently stress-sensitive, since in principle they measure a substrate deflection in the region of a pressure sensor membrane; but substrate deflections of the entire component that has the pressure sensor membrane are also measured. Signals that are based on substrate deflection of the entire component can be distinguished only with great effort, or not at all, from the actually desired pressure signal. Concepts involving the use of reference structures to compensate for substrate deflection of the component exist in the prior art in order to meet this challenge.

An "advanced porous silicon membrane" (APSM) method is occasionally used in order to embody piezoresistive pressure sensors. APSM methods of this kind are described in particular in the documents DE 10 2004 036 032 A1 and DE 10 2004 036 035 A1, to which reference is hereby made for a detailed explanation of APSM methods.

SUMMARY

According to an example embodiment of the present invention, a method for manufacturing a micromechanical component having a disengaged pressure sensor device includes: configuring an electrically conductive sacrificial element in or on a first outer surface of a first substrate; applying, for example bonding, a second substrate on or upon the outer surface of the first substrate over the sacrificial element; configuring a pressure sensor device, encompassing anodic etching of the second substrate; configuring at least one trench, which extends to the sacrificial element, in the second substrate; and removing the sacrificial element in order to disengage the pressure sensor device.

The pressure sensor device can in particular encompass or be made up of a pressure sensor membrane. The pressure sensor device can be configured in particular using an APSM method. "Disengagement" of the pressure sensor device is to be understood in particular to mean that the pressure sensor device is connected to the remainder of the micromechanical component only via a comparatively small and/or thin suspension device, in order to achieve maximum mechanical stress decoupling of the pressure sensor device from the remainder of the micromechanical component. The pressure sensor device can have a size of, for example 400 by 400 micrometers.

According to an example embodiment of the present invention, a micromechanical component having a disengaged pressure sensor device is furnished on a first side of the component, a side of the component facing away from the disengaged pressure sensor device being an unprocessed wafer surface. An "unprocessed wafer surface" is to be understood as a polished or unpolished wafer surface that, in particular, has no open or reclosed etched trenches, through holes, or other structures produced after manufacture of the wafer surface.

The method according to the present invention makes possible the use of APSM methods or at least APSM method steps, in particular the use of anodic etching of the second substrate, to manufacture a disengaged pressure sensor device that exhibits particular high insensitivity to substrate deflections of the micromechanical component.

The method according to the present invention, in particular utilizing APSM method steps, furthermore allows the entire micromechanical component to be manufactured from a single side of the component (e.g., from a wafer top side), so that a second side of the component, in particular a wafer back side, remains intact. The wafer back side that is left intact, i.e., that side of the micromechanical component which faces away from the disengaged pressure sensor device, thus advantageously remains processable for most common standard handling systems during processing and in the context of structural and connection technology, including adhesive bonding of the micromechanical component in a package.

The use of an electrically conductive sacrificial element has an advantage that a current flow upon anodic etching of the second structure is influenced very little or not at all by the sacrificial element.

According to a preferred refinement, the sacrificial element is embodied in monocrystalline fashion. Alternatively, the sacrificial element can be embodied in polycrystalline fashion, with the result that the method can be simplified.

According to a further preferred refinement, the sacrificial element encompasses or is made of germanium, for example a silicon-germanium mixture. Germanium has an advantage that it does not influence a current flow during anodic etching. Germanium moreover can be etched particularly quickly (for instance, several micrometers per minute), for example using xenon difluoride, $XeF_2$ or chlorine trifluoride, $ClF_3$. Germanium is furthermore selective with respect to silicon and highly selective with respect to other materials, for example oxides, nitrides, and metal, which can be utilized in the manufacture of the pressure sensor device.

According to a further preferred refinement, the sacrificial element is embodied over the entire surface upon or on the first outer surface of the first substrate. The method can thereby be carried out in simplified fashion. If germanium is used as a sacrificial element and silicon as a substrate, the first substrate along with the sacrificial element can thus be referred to as a "silicon on germanium" wafer.

If a first element is to be configured "upon" an outer side of a second element, this is to be understood to mean both that it is either configured directly on the second element on the outer side, i.e., the outer surface, of the second element, or that it is configured indirectly over that outer side. If the first element is to be configured "on" the outer side of the second element, this is to be understood to mean that it is configured directly on the outer side, i.e., the outer surface. If the first element is to be disposed in a specific manner with reference to a second element, this is not intended necessarily to specify that the second element must already be configured when the first element is configured. What is described here is instead a final state that the skilled artisan knows how to produce in accordance with the description.

According to a further preferred refinement, the sacrificial element is configured in laterally limited fashion on the first outer surface of the first substrate. The substrate having the sacrificial element configured therein can be referred to as an "engineered" substrate.

Configuration of a sacrificial element that is limited laterally, i.e., in directions parallel to the first outer surface of the first substrate, can improve the dimensional stability of the micromechanical component and thus reduce clearances with respect to micromechanical components that are adjacent during manufacture and/or to any scribe lines on the same wafer.

According to a further preferred refinement, the at least one trench in the second substrate is configured with at least one exempt area that functions as a suspension device for the disengaged pressure sensor device. The exempt area can be configured, for example, as a spring element.

According to a further preferred refinement, an oxide layer having at least one opening is configured on the second substrate before configuration of the at least one trench. Configuration of the trench can be accomplished by introducing an etchant through the at least one opening in order to etch the second substrate. The oxide layer can at least in part be left on the micromechanical component and can function as a suspension device for the disengaged pressure sensor device.

The present invention will be explained in further detail below with reference to the exemplifying embodiments depicted in the schematic figures of the drawings, in which identical or functionally identical elements and apparatuses are labeled with the same reference characters unless otherwise indicated. The numbering of method steps serves for clarification and in particular is not intended, unless otherwise indicated, to imply a specific sequence over time. For example, several method steps can also be carried out simultaneously.

DETAILED DESCRIPTION

FIGS. 1-14 are all schematic cross-sectional views through a micromechanical component that is either being manufactured or is already completed.

FIGS. 1-5 explain a method according to an embodiment of the present invention for manufacturing a micromechanical component having a disengaged pressure sensor device. What is principally described is the manufacture of a single micromechanical component. It is understood that advantageously, a plurality of micromechanical components can be manufactured together on one wafer. The completion of each individual micromechanical component can encompass singulation.

Figure 1:
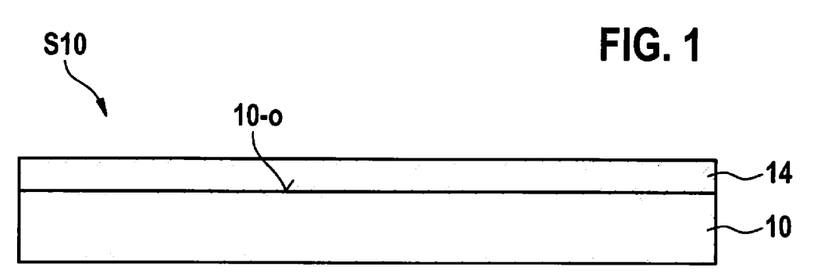
FIGS. 1-5 are schematic depictions to explain a method for manufacturing a micromechanical component having a disengaged pressure sensor device, according to an example embodiment of the present invention.

FIG. 1 shows the manner in which, in a step S10, an electrically conductive sacrificial element 14 is configured on a first outer surface 10-*o* of a first substrate 10. First substrate 10 can in particular be a silicon substrate.

Deposition of an electrically conductive material, in epitaxial or polycrystalline fashion, can be accomplished in order to configure the electrically conductive sacrificial element 14. For example, the electrically conductive sacrificial element 14 is deposited over the entirety of first outer surface 10-*o* of first substrate 10; in other words, the entire outer surface 10-*o* of first substrate 10 is covered with the electrically conductive sacrificial element 14, for instance with a germanium layer.

Figure 2:
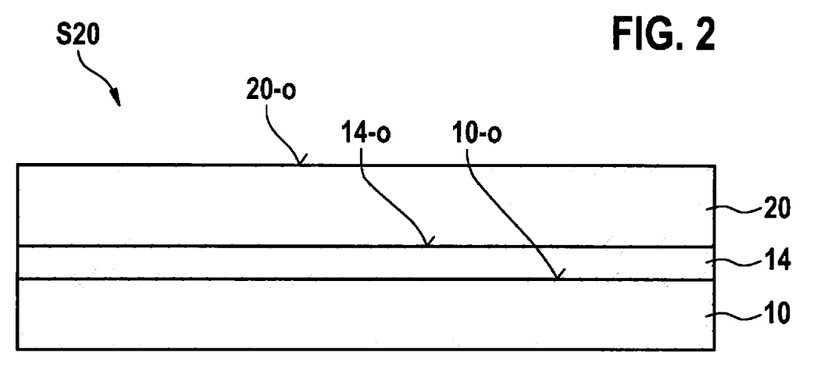

FIG. 2 shows the manner in which, in a step S20, a second substrate 20 is applied upon, in particular on, outer surface 10-*o* of first substrate 10 over sacrificial element 14. In particular, second substrate 20 can be applied directly on sacrificial element 14. For example, second substrate 20 can be bonded directly onto a first outer surface 14-*o*, facing away from first outer surface 10-*o* of first substrate 10, of sacrificial element 14. It can be advantageous for that purpose, for example if polycrystalline germanium is used as an electrically conductive sacrificial element 14, that first outer surface 14-*o* of sacrificial element 14 is previously polished, for example by chemical-mechanical polishing/planarization (CMP).

Prior to bonding of second substrate 20 and sacrificial element 14, the respective surfaces that will be joined to each other can have superficial (native) oxides removed from them.

Second substrate 20 can likewise, for example, be made of silicon or can encompass silicon. In particular, silicon wafers can be used as first and second substrates 10, 20 in order to enable the simultaneous manufacture of a plurality of micromechanical components. Second substrate 20 is preferably a monocrystalline substrate, in particular a monocrystalline silicon substrate. Second substrate 20 can thus constitute or furnish a monocrystalline silicon functional layer on an outer side of the micromechanical component. A membrane and/or piezoresistors can advantageously be configured particularly effectively in or upon such a monocrystalline second substrate 20. Subsequent manufacture of a pressure sensor unit, and/or anodic etching, can thereby be simplified.

Sacrificial element 14 and second substrate 20 can be fusion-bonded, especially when second substrate 20 is made of silicon and sacrificial element 14 is made of germanium or a silicon-germanium mixture or encompasses germanium. Temperatures above 800° C. can be used in this context, since both germanium and silicon are resistant to high temperature.

After application of second substrate 20 on or upon sacrificial element 14, second substrate 20 can be back-thinned to a desired target thickness. The disengaged pressure sensor device will later be configured within that thickness. It can therefore be advantageous to select the thickness of the second substrate upon thinning to be as thin as possible, for example less than 50 micrometers, in order to maintain a small mass for the disengaged pressure sensor device and thus a high resonant frequency. Access points to sacrificial element 14 can furthermore thereby be created more easily and/or more quickly. Alternatively, however, a thickness of second substrate 20 can also be selected to be greater, in particular if larger masses and/or lower resonant frequencies are desired in the later pressure sensor device. Advantageously, a first outer surface 20-$o$ of second substrate 20, which faces away from sacrificial element 14 and from first substrate 10, is also polished, for example by chemical-mechanical planarization, after second substrate 20 is thinned.

Figure 3:
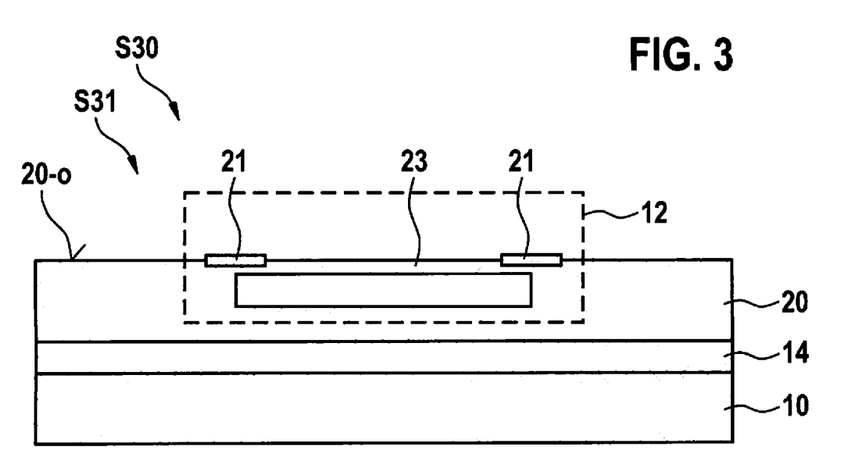

FIG. 3 schematically depicts the manner in which, in a step S30, a (not yet disengaged) pressure sensor device 12 is configured in second substrate 20, in particular on first outer surface 20-$o$ of second substrate 20. In particular, the configuring S30 of pressure sensor device 12 encompasses anodic etching S31 of second substrate 20 on first outer surface 20-$o$ of second substrate 20, where pressure sensor device 12 can be configured with a pressure sensor membrane 23 and a number of piezoelectric resistors 21 for detecting deformations of pressure sensor membrane 23. The configuring S30 of pressure sensor device 12 is advantageously accomplished using an APSM method, in which context porosification of substrate 20 can be achieved. Current transport through first and second substrates 10, 20 and sacrificial element 14 is not impeded in this context due to the electrical conductivity of sacrificial element 14. Sacrificial layers made of silicon oxide or buried cavities, for example, could distort the current flow through first and second substrates 10, 20 necessary for APSM methods, or even make it impossible.

Particularly preferably, sacrificial element 14 is selected so that it does not modify the current flow during anodic etching S31 upon configuration S30 of pressure sensor device 12, in particular does not warp current lines, and/or so that it maintains homogeneous conductivity through first and second substrates 10, 20.

Electrical contacts (not depicted) to piezoelectric resistors 21, and/or bonding pads, can furthermore be configured upon configuration S30 of pressure sensor device 12, in particular in or on first outer surface 20-$o$ of second substrate 20. Here as well, because of the electrical conductivity of sacrificial element 14, it is possible to ensure that there are no serious discrepancies in process performance.

Figure 4:
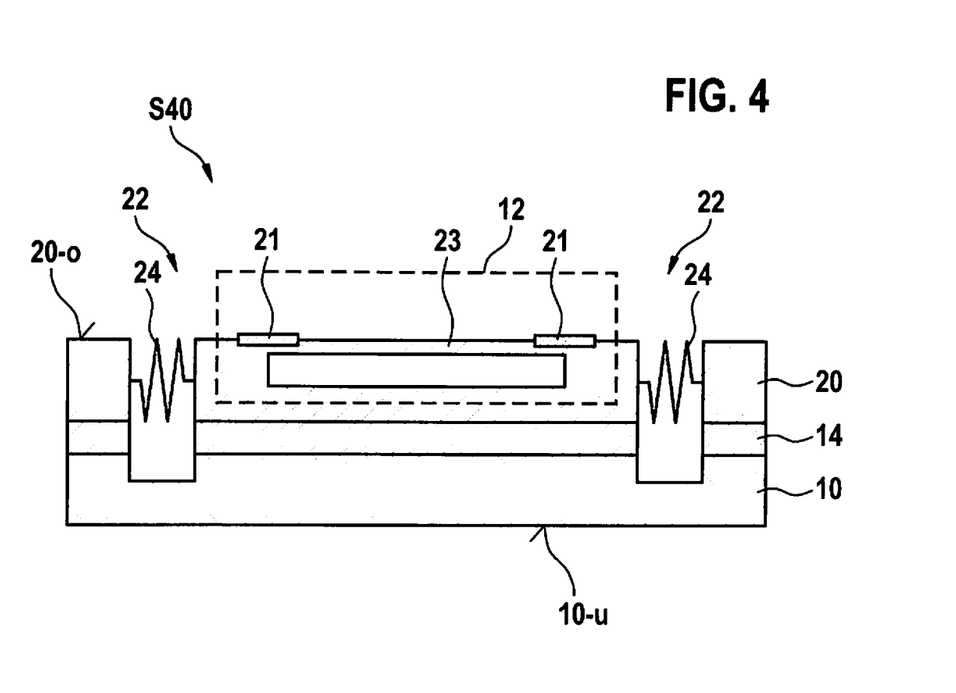

FIG. 4 schematically illustrates the manner in which, in a step S40, at least one trench 22 that extends as far as or beyond sacrificial element 14, for example into first substrate 10, is configured in second substrate 20, more precisely in first outer surface 20-$o$ of second substrate 20. Advantageously, none of trenches 22 is extended through the entirety of the component that is considered as being created, i.e., none of trenches 22 reaches a second outer surface 10-$u$, facing away from sacrificial element 14 and second substrate 20, of first substrate 10.

The at least one trench 22 can be brought about in particular by deep reactive ion etching (DRIE). Deep reactive ion etching is a highly anisotropic dry etching process for producing microstructures in silicon having an aspect ratio (width to depth) of, for instance, up to 50:1.

In accordance with the present embodiment, the at least one trench 22 has at least one exempt area 24, i.e., a structure exempted from etching, which ultimately can or will function as a suspension device for the disengaged pressure sensor device 12. In FIG. 4, two exempt areas 24 are symbolically depicted schematically as elastic springs, this being intended to indicate the mechanical decoupling properties of exempt areas 24 as suspension devices. In actuality, exempt areas 24 can be configured in spring-like fashion and thus with a certain elasticity in order to allow movement, within a certain context, of the subsequently disengaged pressure sensor device 12. Leaving aside exempt areas 24, the at least one trench 22 is preferably configured in such a way that trench 22 completely surrounds pressure sensor device that is later to be disengaged, for example in the shape of a square or rectangle in a plan view looking onto first outer surface 20-$o$ of second substrate 20.

Exempt areas 24 can be configured or left, in particular, flush with first outer surface 20-$o$ of second substrate 20. Exempt areas 24 can, in particular, have any electrical contacts that have already been configured to piezoelectric resistors 21. Alternatively, such electrical contacts can be configured later on exempt areas 24.

Figure 5:
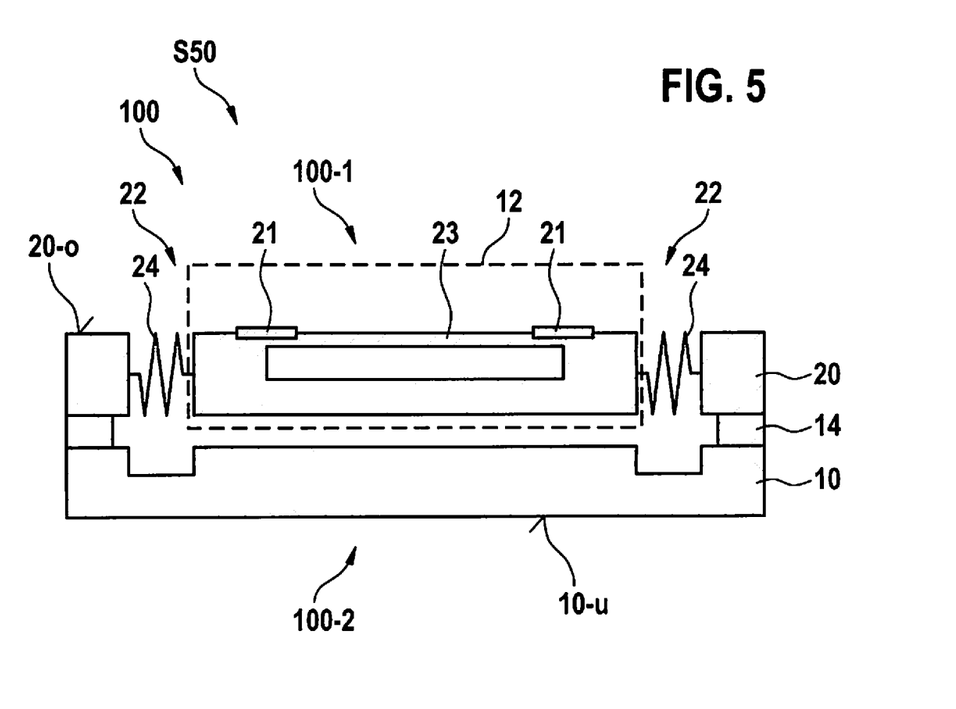

FIG. 5 schematically illustrates the manner in which, in a step S50, sacrificial element 14 is at least partly removed in order to disengage pressure sensor device 12. The removal S50 of sacrificial element 14 is accomplished if sacrificial element 14 is a germanium layer or a layer encompassing or made of a germanium-silicon mixture, advantageously using xenon difluoride, $XeF_2$, or chlorine trifluoride, $ClF_3$. Second outer surface 10-$u$ of first substrate 10 advantageously remains continuous in this context, which can simplify further processing.

First substrate 10 can be back-thinned on second outer surface 10-$u$, before or after the removal S50 of sacrificial element 14, in order to reduce an overall height of the structure, i.e., of the micromechanical component that is being manufactured, or of the wafer structure that is in process and has the plurality of micromechanical components being manufactured. Alternatively, first substrate 10 can also be back-thinned after optional bonding of a cap onto first outer surface 20-$o$ of second substrate 20. The cap is advantageously bonded on over pressure sensor device 12 in order to protect it.

Optionally, after the at least one trench 22 and exempt areas 24 are configured, side walls of pressure sensor device 12 and of exempt areas 24 can be coated with a thin protective layer in order to prevent or reduce lateral etching of those structures during removal S50 of sacrificial element 14. The thin protective layer can be, for example, a silicon dioxide layer having a thickness of, for instance, 100 nanometers.

As is evident from FIG. 5, in the completed component 100, the disengaged pressure sensor device 12 is thus configured on a first side 100-1 of component 100, while second outer surface 10-$u$ of first substrate 10, constituting an unprocessed or merely polished and/or thinned, in particular continuous, wafer surface of the wafer constituting first substrate 10, is disposed on a side 100-2 of the component which faces away from the disengaged pressure sensor device 12. A micromechanical component 100 configured in this manner is particularly easy to process further on side 100-2 of component 100, for example on the wafer while not yet singulated.

FIGS. 6-10 schematically illustrate a method in accordance with a further embodiment of the present invention for manufacturing a micromechanical component having a disengaged pressure sensor device 12. The method in accordance with FIGS. 6-10 differs from the method in accordance with FIGS. 1-5 in that the electrically conductive sacrificial element 14' is configured, according to the method of FIGS. 6-10, not in full-surface fashion, but with lateral boundaries.

Figure 6:
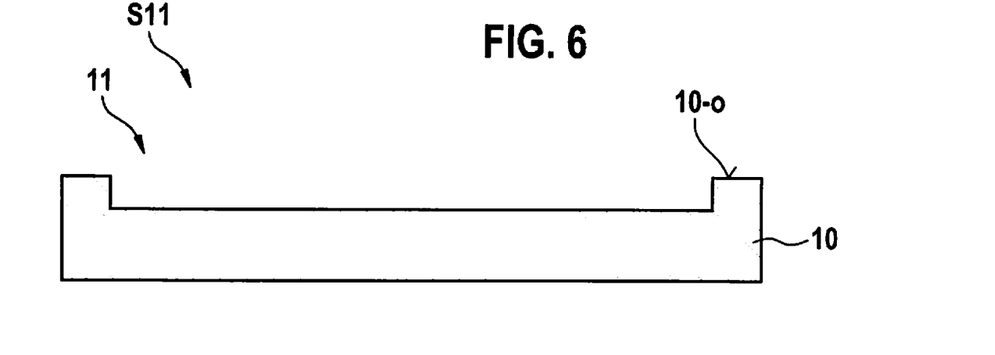
FIGS. 6-10 are schematic depictions to explain another example of a method for manufacturing a micromechanical component having a disengaged pressure sensor device, according to an example embodiment of the present invention.

FIG. 6 schematically illustrates the manner in which, in a step S11, firstly a depression 11 is configured on a first outer surface 10-o of a first substrate 10. For this, in particular, a plurality of depressions can be configured in a single silicon wafer that functions as a first substrate 10 for a plurality of micromechanical components to be manufactured simultaneously. First substrate 10 can be configured in every way as described above with reference to FIGS. 1-5.

Figure 7:
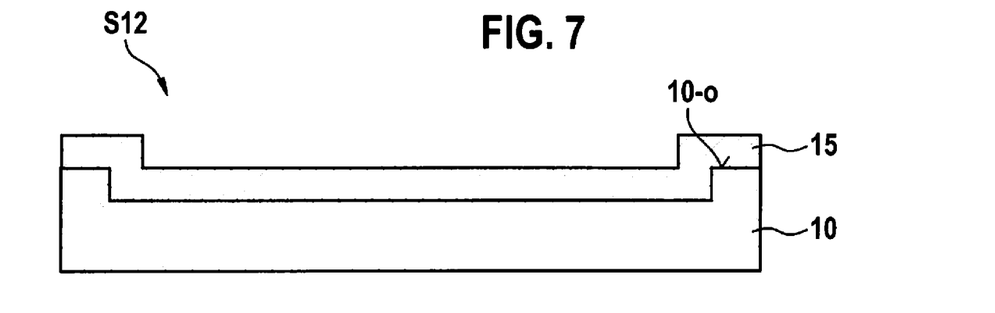

FIG. 7 illustrates the manner in which, in a step S12, an electrically conductive layer 15 is configured on first outer surface 10-o of first substrate 10, both outside and inside depression 11 (or all depressions 11 on a wafer constituting first substrate 10). Electrically conductive layer 15 can, in particular, be made of germanium or a silicon-germanium mixture, or can encompass silicon and/or germanium. The configuring S12 of electrically conductive layer 15 can be accomplished in epitaxial or polycrystalline fashion. In particular, the configuring S12 of electrically conductive layer 15 is accomplished in such a way that the entire outer surface 10-o of first substrate 10, patterned with depressions 11, is covered with electrically conductive layer 15. Advantageously, electrically conductive layer 15 is configured with a thickness that is equal to a depth of depressions 11.

Figure 8:
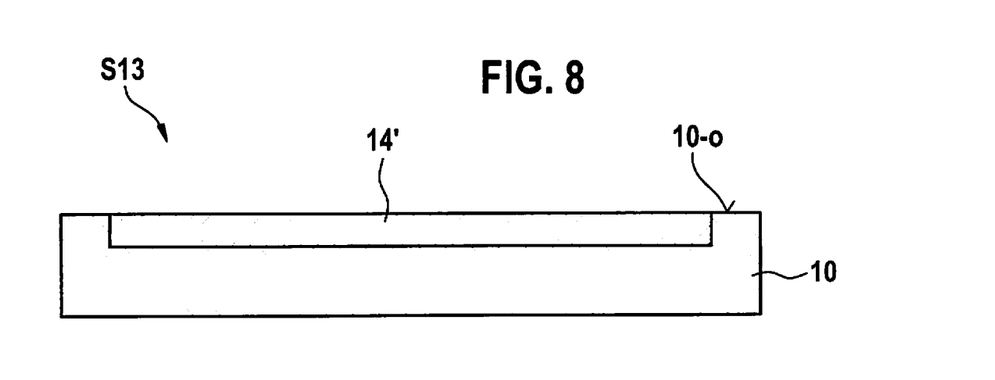

FIG. 8 schematically illustrates the manner in which, in a step S13, the construction produced in steps S11 and S12 is flattened out by way of a grinding or polishing process from the side of first outer surface 10-o of first substrate 10. In particular, this is effected at least, or exactly, until those regions of first outer surface 10-o of first substrate 10 into which a depression 11 was not configured are disengaged. Grinding can also be carried out farther than just as far as the regions not having depressions 11, but advantageously no farther than the bottom of depressions 11, i.e., not so far that electrically conductive sacrificial layer 15 is removed again.

The result, as shown in FIG. 8, is that a residue of electrically conductive layer 15 is configured as a sacrificial element 14' in depressions 11 in first outer surface 10-o of first substrate 10.

Figure 9:
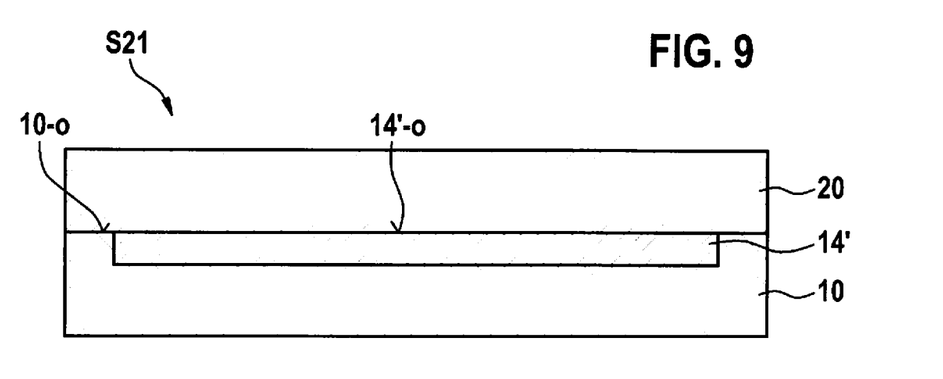

FIG. 9 schematically illustrates the manner in which, in a step S21, a second substrate 20 is applied on outer surface 10-o of first substrate 10 and/or in which a second substrate 20 is applied on an outer surface 14'-o, coplanar with first outer surface 10-o of first substrate 10, of sacrificial element 14', for example as described with reference to FIG. 2 and to method step S20.

Second substrate 20 can be configured as described with reference to FIGS. 1-5, i.e., second substrate 20, for example, likewise can be made of or can encompass silicon. In particular, silicon wafers can be used as first and second substrates 10, 20 in order to enable simultaneous manufacture of a plurality of micromechanical components. Second substrate 20 is preferably a monocrystalline substrate, in particular a monocrystalline silicon substrate.

Method steps S30, S31, S40, and S50 can subsequently be carried out as described previously with reference to FIGS. 3-5. A micromechanical component 100' completed in this fashion is shown by way of example in FIG. 10.

Figure 10:
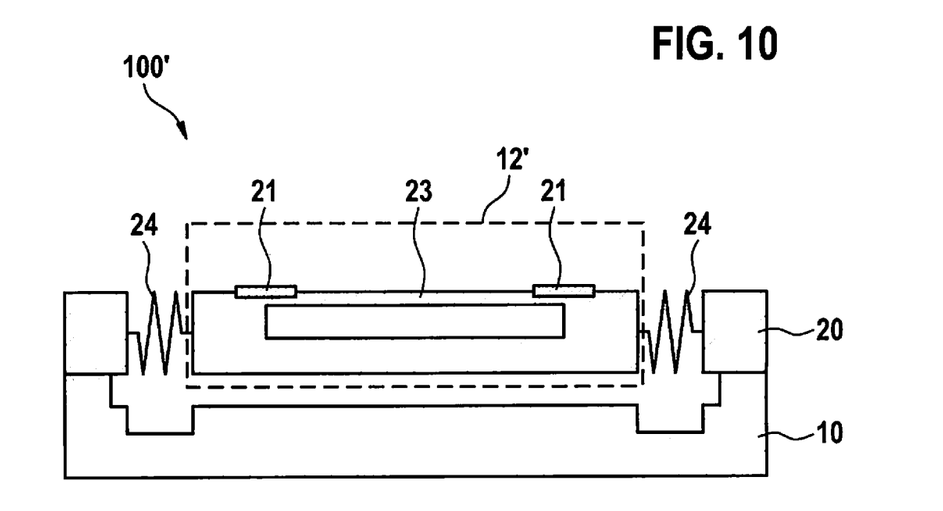

As a result of the patterning and lateral limitation of sacrificial element 14', specifically by parts of substrate 10, an unnecessary under-etching of second substrate 20 out from pressure sensor device 12 toward a lateral edge of the micromechanical component can be avoided. This can result in stabilization of micromechanical component 100 and in a space reduction.

With this variant of the method, sacrificial element 14' advantageously can be completely removed in step S50, which can simplify process management without thereby degrading the structural integrity of the component.

FIGS. 11-14 illustrate method steps of a method according to yet another embodiment of the present invention for manufacturing a micromechanical component 100' having a disengaged pressure sensor device 12'. The method in accordance with FIGS. 11-14 is a variant of the methods in accordance with FIGS. 1-5 or in accordance with FIGS. 6-10, and follows on either from method steps S10, S20, S30, and S31 or from method steps S11, S12, S13, S21, S30, and S31.

Concretely, FIGS. 1-14 depict by way of example the situation in which firstly steps S11, S12, S13, S21, S30, and S31 have been carried out.

Figure 11:
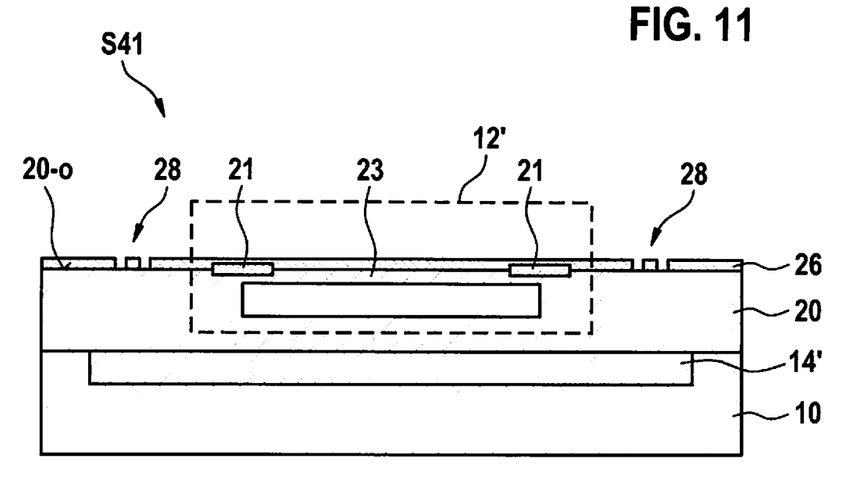
FIGS. 11-14 are schematic depictions to explain another example of a method for manufacturing a micromechanical component having a disengaged pressure sensor device, according to an example embodiment of the present invention.

FIG. 11 schematically illustrates the manner in which, in a step S41, a patterned oxide layer 26 is configured on first outer surface 20-o of second substrate 20 and on a pressure sensor device 12' that is configured in the preceding steps S30, S31 but is not yet disengaged. Patterned oxide layer 26 is configured in patterned fashion in such a way that it has at least one opening 28, preferably a plurality of openings 28, which extend through oxide layer 26 as far as first outer surface 20-o of second substrate 20.

Openings 28 in oxide layer 26 can have, for example, a lattice structure. The oxide layer can be, for example, silicon oxide. Openings 28 are preferably embodied in such a way that a continuous lattice structure extends annularly around pressure sensor device 12' that is to be disengaged.

Figure 12:
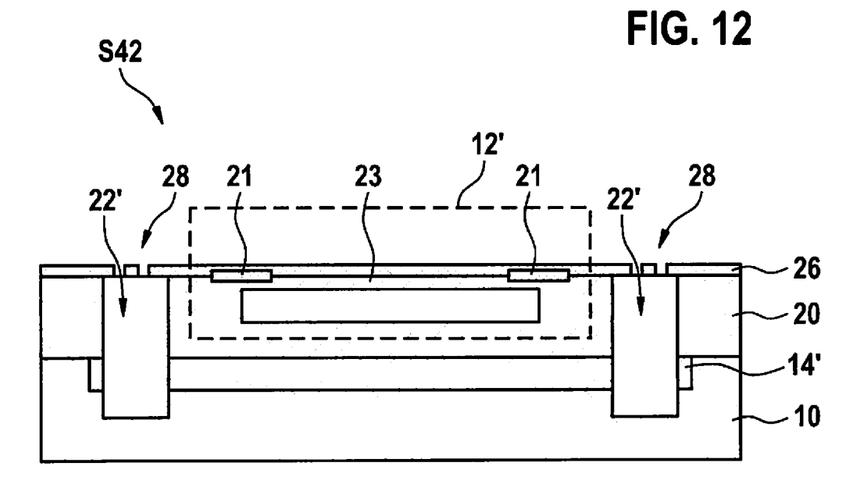

FIG. 12 schematically illustrates the manner in which, in a step S42, at least one trench 22' is configured through second substrate 20 at least as far as sacrificial element 14', by the fact that an etchant is introduced through the at least one opening 28 in order to etch second substrate 20. Advantageously, a single trench 22', constituting a continuous insulating trench, can be configured around pressure sensor device 12' that is to be disengaged, said trench being spanned by oxide layer 26 for particularly comprehensive mechanical decoupling of pressure sensor device 12'.

Oxide layer 26 is preferably configured in the entire region that is located above trench 22', continuously with a lattice structure having holes. After the disengagement of pressure sensor device 12', this lattice structure can function as a suspension device for the disengaged pressure sensor device 12'. Configuration of the at least one trench 22' can also be effected by way of a deep reactive ion etching (DRIE) process. This advantageously establishes an edge loss that brings about complete disengagement of the at least one trench 22', analogously to "air-gap through-silicon vias" (TSVs).

Figure 13:
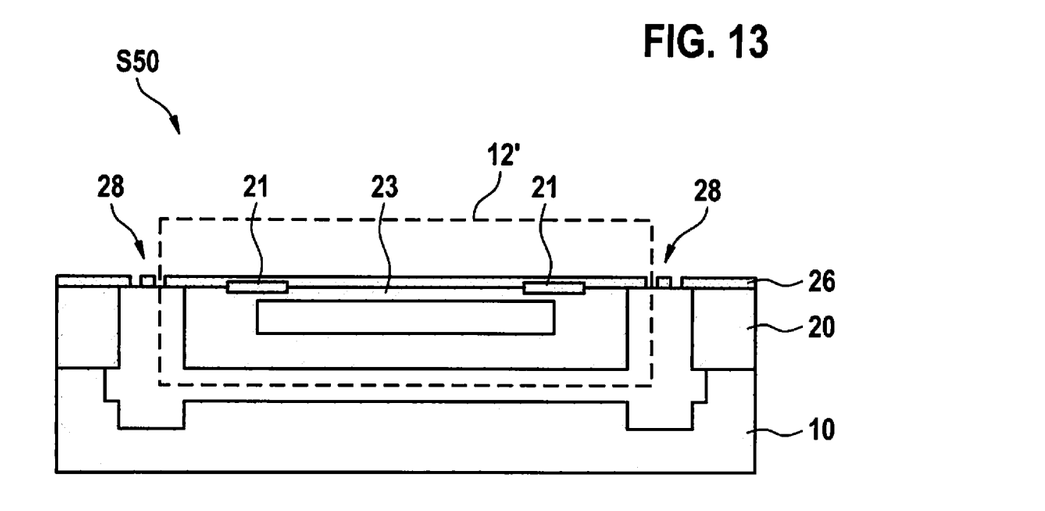

FIG. 13 schematically illustrates the manner in which, in a step S50 as also described with reference to FIG. 5, sacrificial element 14' is removed, in particular completely, in order to disengage pressure sensor device 12'.

Xenon difluoride, $XeF_2$, or chlorine trifluoride, $ClF_3$, is preferably used as an etchant. Because of the high etching selectivity of these etchants with respect to an oxide, advantageously very little or no weakening of oxide layer 26 in the region of trench 22' is caused.

Figure 14:
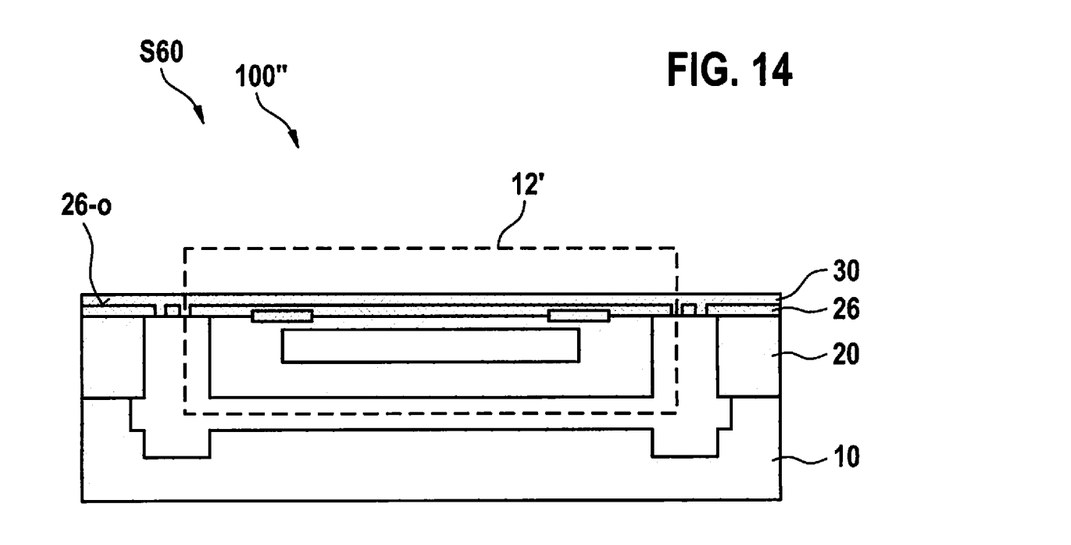

FIG. 14 schematically shows the manner in which, in a step S60 after removal S50 of sacrificial element 14', a sealing layer 30 is optionally configured on an outer surface 26-o, facing away from second substrate 20, of oxide layer 26. Sealing layer 30 can, for example, encompass or be made of silicon oxide and/or silicon nitride. Also optionally, a new hole can be configured in sealing layer 30 for pressure equalization. Alternatively or additionally, a larger hole can be provided in a lattice structure of at least one opening 28 in oxide layer 26, which hole is not completely sealed upon configuration of sealing layer 30. FIG. 14 also shows, in a schematic cross-sectional view, micromechanical component 100" manufactured using the method according to FIGS. 1-14.

What is claimed is:

1. A method for manufacturing a micromechanical component, the method comprising:
    applying an electrically conductive sacrificial element in or on a first outer surface of a first substrate;
    applying a second substrate on the sacrificial element over the first outer surface of the first substrate;
    performing anodic etching of the second substrate to form a pressure sensor;
    applying on the second substrate an oxide layer having at least one opening;
    introducing an etchant through the at least one opening to etch the second substrate, thereby
    forming in the second substrate at least one trench that extends to the sacrificial element; and
    at least partly removing the sacrificial element in order to disengage the pressure sensor, wherein at least part of the oxide layer, which is left on the micromechanical component, suspends the disengaged pressure sensor.

2. The method of claim 1, wherein the sacrificial element is in monocrystalline or polycrystalline form.

3. The method of claim 1, wherein the sacrificial element includes germanium.

4. The method of claim 1, wherein the removing of the sacrificial element includes etching with xenon difluoride or chlorine trifluoride.

5. The method of claim 1, wherein the applying of the sacrificial element includes applying the sacrificial element over an entirety of the first outer surface of the first substrate.

6. The method of claim 1, wherein, in the applying of the sacrificial element, the sacrificial element is applied in a laterally limited fashion on the first outer surface of the first substrate so that the sacrificial element does not cover an entirety of the first outer surface of the first substrate.

7. The method of claim 1, wherein the second substrate includes at least one exempt area where the at least one trench is formed, the exempt area forming a suspension for the disengaged pressure sensor.

* * * * *